United States Patent
Phillips

(10) Patent No.: US 7,283,201 B2
(45) Date of Patent: Oct. 16, 2007

(54) DEVICES AND METHODS FOR SENSING SECURE ATTACHMENT OF AN OBJECT ONTO A CHUCK

(75) Inventor: Alton H. Phillips, East Palo Alto, CA (US)

(73) Assignee: Nikon Corporation, Tokyo (JP)

( * ) Notice: Subject to any disclaimer, the term of this patent is extended or adjusted under 35 U.S.C. 154(b) by 185 days.

(21) Appl. No.: 11/259,536

(22) Filed: Oct. 25, 2005

(65) Prior Publication Data

US 2007/0091291 A1    Apr. 26, 2007

(51) Int. Cl.
*G03B 27/42* (2006.01)
(52) U.S. Cl. .................. 355/53; 355/72; 355/75; 250/492.2; 378/34
(58) Field of Classification Search ............. 355/53, 355/72, 75
See application file for complete search history.

(56) References Cited

U.S. PATENT DOCUMENTS 6,693,284 B2   2/2004  Tanaka
6,867,534 B2   3/2005  Tanaka
2002/0109823 A1  8/2002  Binnard et al.

*Primary Examiner*—D. Rutledge
(74) *Attorney, Agent, or Firm*—Klarquist Sparkman, LLP

(57) ABSTRACT

Stage devices are disclosed for holding an object such as a reticle for use in microlithography. An exemplary stage device includes a movable object-holder that holds the object. At least one actuator moves the object-holder. A position-detector determines a position of the object-holder, wherein the position-detector produces a first position signal whenever the object-holder is not holding the object and produces a second position signal whenever the object-holder is holding the object. A controller, connected to the position-detector and to the at least one actuator, produces a first control signal upon receiving the first position signal and a second control signal upon receiving the second position signal. These control signals cause the at least one actuator to place or hold the object-holder at a pre-determined position whether the object-holder is not holding or is holding the object. The controller also determines whether the object is not being held or is being held by the object-holder based on whether the controller is receiving the first position signal or the second position signal, respectively.

49 Claims, 5 Drawing Sheets

DEVICES AND METHODS FOR SENSING SECURE ATTACHMENT OF AN OBJECT ONTO A CHUCK

FIELD

This disclosure pertains generally to devices and methods for sensing whether an object has been securely attached to a chuck configured to hold the object. More specifically, the subject devices and methods can be used for sensing whether a planar object, such as a semiconductor wafer or reticle, delivered to a downward-facing chuck by a robotic manipulator, is securely attached to the chuck so that the manipulator can be retracted from the chuck without the object falling from the chuck. Reticles and semiconductor wafers are commonly used in microlithography, in which imaging of a circuit layer from the reticle to the wafer is performed using a beam of either electromagnetic radiation or charged particles. An exemplary microlithography technology is extreme ultraviolet (EUV) microlithography.

BACKGROUND

Many aspects of semiconductor processing have been automated for efficiency and for better control of cleanliness of the processes. This automation has been achieved in part by extensive employment of robots and other automatic manipulators and handling devices for moving semiconductor wafers and other objects to and from processing positions, for moving wafers and other objects from one processing apparatus to another, and for positioning wafers and other objects as required for performing a particular process step.

An exemplary process used extensively in the manufacture of semiconductor devices, especially of integrated circuits, is "microlithography." Microlithography involves the "transfer" of a pattern, having extremely small features, from a pattern-defining object to an imprintable object. In "projection-microlithography" the pattern-defining object is usually termed a "reticle" or "mask" (generally termed "reticle" herein) and the imprintable object is termed a "substrate," which usually is a semiconductor wafer that may or may not already have previously formed circuit layers on its surface. (Consequently, substrates are also generally termed "wafers.") So as to be imprintable with an image, the substrate is coated with a radiation-sensitive composition termed a "resist."

Projection-microlithography systems are used extensively, for example, for manufacturing integrated circuits, microprocessors, memory "chips," and the like. These products characteristically comprise multiple functional layers of microscopic circuit elements, all interconnected together in 3-dimensional space. Typically, microlithography is used for patterning most, if not all, the functional layers. In each microlithographic step, the pattern-defining object (usually the reticle) defines the respective pattern for the particular functional layer to be formed. A beam of exposure radiation, termed an "illumination beam," is directed by an "illumination-optical system" from a source to the pattern-defining object. Interaction of the illumination beam with the pattern-defining object (i.e., selective transmission of the illumination beam through the pattern-defining object or selective reflection of the illumination beam from the pattern-defining object) results in patterning of the beam (now termed a "patterned beam" or "imaging beam"), which renders the patterned beam capable of forming an aerial image of the illuminated pattern. The patterned beam is projected by a "projection-optical system" onto a desired location on the resist-coated substrate where an actual image of the illuminated pattern is formed. Thus, a projection-microlithography system is a type of camera that projects and forms an image on the resist-coated substrate (analogous to a sheet of photographic paper) corresponding to the pattern defined by the pattern-defining object (analogous to a photographic negative, for example).

For exposure, the reticle usually is held by a respective chuck on a device called a "reticle stage," and the substrate usually is held by a respective chuck on a device called a "substrate stage" or "wafer stage." These stages also are typically equipped to perform highly accurate positional measurements and positioning in response to the measurements. Some microlithography systems have multiple reticle stages and/or multiple substrate stages which allow, for example, pre-exposure or post-exposure manipulations to be performed on other reticles and substrates, respectively, as an exposure is being performed on a particular substrate.

Before being exposed, and to prepare the substrate for exposure, the substrate is usually primed and then coated with a layer of a suitable resist. Before actual exposure, the resist usually is treated such as by a soft-bake step ("pre-exposure bake"). After exposure, the substrate may be soft-baked again ("post-exposure bake"), followed by development of the resist and a hard-bake step to prepare the resist for downstream process steps such as etching, doping, metallization, oxidation, or other suitable step in which the remaining resist on the substrate surface serves as a process mask. Thus, the respective layer is formed on the substrate. As noted above, multiple layers must be formed on the substrate in order to fabricate actual semiconductor devices, so these or similar process steps usually need to be repeated multiple times during the fabrication of the devices. During formation of each layer, steps must be taken to ensure proper and accurate registration of the new layer with the previously formed layer(s).

The substrate usually is sufficiently large to allow formation of multiple semiconductor devices at respective locations ("dies") on the substrate. Exposure of multiple dies on the substrate can be die-to-die in one shot per die (characteristic of a "step-and-repeat" exposure scheme) or by scanning each die (characteristic of a "step-and-scan" exposure scheme). In step-and-scan each die typically is exposed by scanning in a scanning direction, wherein both the reticle and the substrate are moved during scanning. Movement of the reticle and substrate can be in the same direction or in opposite directions. If the projection-optical system has a magnification factor (M) other than unity, then the scanning velocity of the substrate typically is M times the scanning velocity of the reticle.

After completing the fabrication of all the required layers on the surface of the substrate, the dies are cut one from the other. Individual dies are mounted on a packaging substrate, connected to pins or the like, and encased to form finished semiconductor devices. The finished devices typically undergo rigorous testing before being released for sale.

Accompanying the acknowledgement of an apparent limit (not yet defined) of the minimum feature size of a pattern that can be transferred at an acceptable resolution by optical microlithography, a substantial ongoing effort currently is being directed to the development of a practical "next-generation lithography" ("NGL") technology. One promising NGL approach is EUV lithography ("EUVL") performed generally in the wavelength range of 5-20 nm and more specifically at a wavelength in the range of approximately 11-14 nm.

One challenge posed by EUVL is the substantial scattering and attenuation of an EUV beam by normal-pressure air. Consequently, the propagation path of an EUV beam in an EUVL system must be maintained at high vacuum. Another challenge posed by EUVL is the lack of any known material that is EUV-transmissive and capable of refracting EUV light. Consequently, all the optical elements in an EUV optical system must be reflective rather than refractive. These reflective optical systems and elements include the illumination-optical system, the projection-optical system, and the reticle itself.

Certain aspects of a conventional EUVL system 110 are shown in FIG. 4. The depicted system includes an EJV source 112, an illumination-optical system 114, and a projection-optical system 116. The EUV source 112 produces pulses of EUV light from, for example, a laser-induced plasma or electrical-discharge-induced plasma.

The depicted illumination-optical system 114 includes a collimator mirror 118, a first fly-eye mirror 120, a second fly-eye mirror 122, a first condenser mirror 124, a second condenser mirror 126, and a grazing-incidence mirror 128. These mirrors are mounted at respective locations on a rigid frame (not detailed) so as to place the mirrors in proper respective positions relative to each other. The collimator mirror 118 collimates the EUV light from the source 112 as the EUV light reflects from the collimator mirror. The collimated light propagates to the first fly-eye mirror 120, from which the light reflects to the second fly-eye mirror 122. The fly-eye mirrors 120, 122 make the illumination intensity of the EUV light substantially uniform over the illumination field. From the second fly-eye mirror 122 the EUV light assumes a gradually convergent characteristic as the EUV light propagates to and reflects from the first and second condenser mirrors 124, 126. From the second condenser mirror 126 the EUV light reflects (at grazing incidence) from the grazing-incidence mirror 128 (usually a planar mirror) to the reticle 130 where the illumination field illuminates respective selected portions of the reticle pattern at particular instances in time. During illumination the reticle 130 is mounted (reflective-side facing downward) on a reticle chuck 132 that is mounted on a movable reticle stage 134. The reticle stage 134 positions the reticle 130 in three-dimensional space as required for illumination of the desired portions of the reticle pattern by the illumination field at respective instances in time.

The particular type of illumination-optical system 114 shown in FIG. 4 is a 6-mirror system. So as to be reflective to incident EUV light at less than grazing angles of incidence, the collimator mirror 118, fly-eye mirrors 120, 122, and condenser mirrors 124. 126 have surficial multilayer-interference coatings (e.g., multiple superposed and very thin layer pairs of Mo and Si) that render the surfaces of these mirrors reflective to incident EUV light. Due to the manner in which the EUV light reflects from the grazing-incidence mirror 128 (i.e., at grazing angles of incidence), the grazing-incidence mirror need not have a multilayer coating. In the EUV source 112, the collector mirror 136 also has a multilayer-interference coating.

Because of the lack of suitable reticle-making materials exhibiting significant transparency to EUV light, the reticle 130 is a reflective reticle. EUV light from the grazing-incidence mirror 128 is incident on the reticle 130 at a small angle of incidence (approximately 5 degrees). So as to be reflective to EUV light at such a small angle of incidence, the reticle 130 also has a multilayer-interference coating as well as EUV-absorbent bodies that define, along with spaces between the bodies, the particular pattern on the reticle that is to be transferred to the substrate. Thus, as the EUV light reflects from the irradiated region of the reticle 130, the EUV light is "patterned" by differential reflection of the light from the pattern defined on the reticle. The patterned beam 138 acquires an aerial image of the pattern on the reticle 130 and thus is rendered capable of imaging the illuminated pattern on the surface of the resist-coated substrate 140.

To form the image on the surface of the substrate 140, the "patterned" EUV light 138 reflected from the reticle 130 passes through the projection-optical system 116, which also contains multiple reflective mirrors (not detailed), to the resist-coated substrate (wafer) 140. During exposure the wafer 140 is mounted (face up) to a wafer chuck 142 that is mounted on a wafer stage 144.

When performing microlithography, it is necessary to move wafers into and out of position for imaging, while maintaining an extremely high standard of wafer cleanliness. To such end, "wafer handlers" (wafer-manipulating robots) 148 are extensively used for placing wafers 140 on the wafer stage 144 for exposure and for removing wafers from the wafer stage after exposure. The wafer stage 144 is movable to place the wafer 140 in the proper positions for exposure of different regions of the wafer. Similarly, the reticle stage 134 is movable to allow placement of the reticle 130 at proper positions for making exposures. Since the reticle 130 is very valuable and also must be kept extremely clean, the reticle normally is moved to and from the reticle stage 134 using a "reticle handler" (reticle-manipulating robot) 146, which avoids contaminating the reticle by human handling and offers high accuracy and precision of reticle placement.

As noted above, in current EUV microlithography systems, the reticle 130 is held face-down on the reticle stage 134 during use for making lithographic exposures. To hold the reticle 130 in such a manner, the reticle stage 134 is equipped with a "reticle chuck" 132 that must be capable of holding the mass of the reticle securely against the force of gravity and also against acceleration and deceleration forces imparted to the reticle 130 during motions of the reticle stage 134. Since EUV microlithography must be performed under high-vacuum conditions, the reticle chuck 132 must be capable of performing its task reliably under high-vacuum conditions. Several types of reticle chucks exhibit this kind of performance, but the currently best approach for holding the reticle 130 is attraction of the reticle to the surface of the reticle chuck 132 by electrostatic or Lorentz forces. In both of these approaches the reticle chuck 132 includes electrodes that are electrically energized whenever the chuck must hold the reticle 130, and that are de-energized whenever the chuck is not holding the reticle. In either of these approaches, the reticle must be in a proper position and in close proximity to the surface of the reticle chuck 132 at commencement of electrode energization to provide conditions under which the reticle 130 can be fully held by the chuck. If the reticle 130 is not fully held, then the reticle either will not adhere or will only partially adhere to the chuck 132 as the reticle handler 146 (which has delivered the reticle to the chuck) is retracted or will fall from the chuck 132 as or after the reticle handler 146 is retracted.

Thus, whenever a reticle handler 146 has delivered the reticle 130 to the reticle chuck 132, it is desirable that a determination be made as to whether the reticle is properly placed relative to the chuck and is being held securely by the chuck before the reticle handler 146 is retracted (i.e., moved away from the reticle chuck 132). Conventionally, this determination is made using extraneous reticle-position sensors, e.g., sensors that detect light reflected from the reticle 130 or sensors that detect a break in a beam of light caused by the reticle being at the reticle chuck 132. A key drawback of these types of sensors is that they add further hardware and more complexity to the microlithography system in general. For example, these types of sensors require additional electronics to control their operation, to process signals from them, and to generate and actuate responses to their signals.

SUMMARY

Addressing certain disadvantages of conventional stage devices and methods, the instant disclosure provides, inter alia, stage devices for holding an object. An embodiment of such a stage device comprises a movable object-holder configured to hold the object, at least one actuator, a position-detector, and a controller. The at least one actuator moves the object-holder. The position-detector determines a position of the object-holder, wherein the position-detector produces a first position signal whenever the object-holder is not holding the object and produces a second position signal whenever the object-holder is holding the object. The controller, connected to the position-detector and to the at least one actuator, is configured to produce a first control signal upon receiving the first position signal and to produce a second control signal upon receiving the second position signal. The first and second control signals cause the at least one actuator to place or hold the object-holder at a pre-determined position whether the object-holder is not holding or is holding the object. The controller also determines whether the object is not being held or is being held by the object-holder based on whether the controller is receiving the first position signal or the second position signal, respectively. By way of example, this stage device is a reticle stage, wherein the object is a reticle, the object-holder comprises a reticle fine stage and a reticle chuck mounted on the reticle fine stage, the at least one actuator moves the reticle fine stage and thus the reticle chuck, and the first and second control signals cause the at least one actuator to place or hold the reticle fine stage, and thus the reticle chuck, at the predetermined position. The reticle chuck can hold the reticle in any of various orientations, such as face-down.

Another embodiment of a stage system comprises a movable object-holder configured to hold the object, at least one actuator, a position-detector, an object robot, and a controller. The at least one actuator moves the object-holder. The position-detector determines the position of the object-holder and produces a first position signal whenever the object-holder is not holding the object and produces a second position signal whenever the object-holder is holding the object. The object robot is situated relative to the object-holder and delivers the object for holding by the object-holder and to receive the object released from the object-holder. The controller, connected to the position-detector and to the at least one actuator, produces a first control signal upon receiving the first position signal and produces a second control signal upon receiving the second position signal. The first and second control signals cause the at least one actuator to place or hold the object-holder at a pre-determined position whether the object-holder is not holding or is holding the object delivered by the object robot. The controller also determines whether the object is not being held or is being held by the object-holder based on whether the controller is receiving the first position signal or the second position signal, respectively.

Yet another embodiment of a stage device comprises an object-holder, at least one actuator, at least one position-detector, and a controller. The object-holder holds the object and is movable at least in a movement direction having a vertical component. The at least one actuator moves the object-holder in the movement direction. The at least one position-detector determines a position of the object-holder in the movement direction. The controller is connected to the at least one actuator and to the at least one position-detector in a feedback-controlled manner such that data from the at least one position-detector is fed-back to the controller to maintain the object-holder at a predetermined position in the movement direction. The controller, based on the fed-back data, causes a respective energization, depending upon whether the object-holder is holding the object or not holding the object, of the at least one actuator as required to maintain the object-holder at the predetermined position. The fed-back data provides an indication of whether or not the object is being held by the object-holder. This stage device can be configured, for example, as a reticle stage, wherein the object is a reticle, the object-holder comprises a reticle fine stage and a reticle chuck mounted on the reticle fine stage, the at least one actuator is configured to move the reticle fine stage and thus the reticle chuck in the movement direction, and based on the fed-back data, the controller causes the at least one actuator to place or hold the reticle fine stage, and thus the reticle chuck, at the predetermined position.

Yet another embodiment of a stage system comprises an object-holder, at least one actuator, at least one position-detector, an object robot, and a controller. The object-holder holds the object and is movable at least in a movement direction having a vertical component. The at least one actuator moves the object-holder in the movement direction. The at least one position-detector determines a position of the object-holder in the movement direction. The object robot is situated relative to the object-holder and is operable to deliver the object for holding by the object-holder and to receive the object released from the object-holder. The controller is connected to the at least one actuator and to the at least one position-detector in a feedback-controlled manner such that data from the at least one position-detector is fed-back to the controller to maintain the object-holder at a predetermined position in the movement direction. The controller, based on the fed-back data, causes a respective energization, depending upon whether the object-holder is holding or not holding the object delivered to the object-holder by the object robot, of the at least one actuator as required to maintain the object-holder at the predetermined position. The fed-back data provides an indication of whether or not the object delivered by the object robot is being held by the object-holder.

A stage device according to another embodiment comprises object-holding means, actuator means, detection means, feed-back means, and control means. The object-holding means is for holding the object and moves the object at least in a movement direction having a vertical component. The actuator means is for moving the object-holding means in the movement direction. The detection means is for determining a position of the object-holding means in the movement direction. The control means is for actuating the actuator means based on a signal from the detection means. The feed-back means is for feeding data from the detection means back to the control means, with which fed-back data the control means maintains the object-holding means at a predetermined position in the movement direction by causing a respective energization of the actuator means depending upon whether the object-holding means is holding the object or not holding the object. The fed-back data provides an indication of whether or not the object is being held by the object-holding means. The object can be, for example, a reticle, in which event the stage device is a reticle stage. In such a configuration the object-holding means comprises a stage means and a reticle-chuck means mounted on the stage means. The actuator means is configured to move the stage means and thus the reticle-chuck means, and the control means, based on data fed back by the feed-back means, causes the actuator means to place the stage means, and thus the reticle-chuck means, at the predetermined position.

Yet another embodiment of a stage system comprises object-holding means, actuator means, detection means, object-delivery means, control means, and feed-back means. The object-holding means holds the object and moves the object at least in a movement direction having a vertical component. The actuator means moves the object-holding means in the movement direction. The detection means determines a position of the object-holding means in the movement direction. The object-delivery means delivers the object for holding by the object-holding means and for receiving the object released from the object-holding means. The control means actuates the actuator means based on a signal from the detection means. The feed-back means feeds data from the detection means back to the control means, with which fed-back data the control means maintains the object-holding means at a predetermined position in the movement direction by causing a respective energization of the actuator means depending upon whether the object-holding means is holding the object or not holding the object delivered by the object-delivery means, the fed-back data providing an indication of whether or not the object is being held by the object-holding means.

Yet another embodiment of a stage device comprises a base, an object holder, at least one actuator, a position detector, and a controller. The object-holder is movable relative to the base and is configured to hold the object. The at least one actuator is situated relative to the base and the object-holder and is configured to move the object-holder relative to the base. The position-detector is situated relative to the object-holder and is configured to determine a position of the object-holder relative to the base. The position-detector is operable to produce a first position signal whenever the position-detector detects a first displacement of the object-holder caused by a collective mass of the object-holder and to produce a second position signal whenever the position-detector detects a second displacement of the object-holder caused by a collective mass of the object-holder and object being held by the object-holder. The controller, connected to the position-detector and to the at least one actuator, produces a first control signal upon receiving the first position signal and produces a second control signal upon receiving the second position signal. The first control signal and second control signal cause the at least one actuator to place the object-holder at a desired position whenever the object-holder is not holding and whenever the object-holder is holding, respectively, the object. The controller also determines whether the object is not being held or is being held by the object-holder based on whether the controller is receiving the first position signal or the second position signal, respectively. A difference of the second displacement relative to the first displacement is correlated, for example, to the mass of the object times gravitational acceleration.

Desirably, the object-holder is movable with respect to the base without contacting the base. The object-holder can be, for example, an object-chuck. Further by way of example, the object is a reticle and the object-chuck is a reticle chuck. The reticle can be held face-down. The object-holder is movable in at least one degree of freedom of motion relative to the base. The object-holder can have a mounting surface extending in an xy plane, wherein the at least one degree of freedom includes movement of the object-holder along the z-axis perpendicular to the xy plane.

More desirably, the object-holder is movable in multiple degrees of freedom of motion relative to the base, in which event the stage device desirably further comprises at least one respective actuator and at least one respective position-sensor for each degree of freedom of motion. In this embodiment the controller desirably is connected to each actuator and to each position-sensor, and each position-sensor is configured to produce respective first and second position signals. The controller produces, for each actuator, respective first and second control signals. The controller is further configured to determine whether the object is not being held or is being held by the object-holder based on the first position signals relative to the second position signals, respectively.

The stage device can include a coarse stage that is movable relative to the base and a fine stage to which the object-holder is mounted, wherein the fine stage is movable relative to the coarse stage and hence to the base.

The controller can be further configured to initiate a first operational response whenever the object is detected as not being held by the object-holder and to initiate a second operational response whenever the object is detected as being held by the object-holder. The first operational response can be appropriate for a situation in which the object is not being held by the object-holder, so as to avoid damaging the object. The second operational response can be appropriate for a situation in which the object is being held by the object-holder.

A stage system according to yet another embodiment comprises an object-holder, at least one actuator, a position-sensor, an object robot, and a controller. The object-holder is movable relative to the base and is configured to hold the object. The at least one actuator is situated relative to the base and the object-holder and configured to move the object-holder relative to the base. The position-detector is situated relative to the object-holder and is configured to determine a position of the object-holder relative to the base. The position-detector is operable to produce a first position signal whenever the position-detector detects a first displacement of the object-holder caused by a collective mass of the object-holder and to produce a second position signal whenever the position-detector detects a second displacement of the object-holder caused by a collective mass of the object-holder and object being held by the object-holder. The object robot is situated relative to the stage and is operable to place the object for holding by the object-holder and to receive the object released from the object-holder. The controller is connected to the position-detector and to the at least one actuator, and is configured to produce a first control signal upon receiving the first position signal and a second control signal upon receiving the second position signal. The first control signal and second control signal cause the at least one actuator to place the object-holder at a desired position whenever the object-holder is not holding and whenever the object-holder is holding, respectively, the object delivered by the object robot. The controller also determines whether the object is not being held or is being held by the object-holder based on whether the controller is receiving the first position signal or the second position signal, respectively.

Yet another embodiment of a stage system comprises a movable stage, an object-holder, at least one actuator, a position-detector, an object robot, and a controller. The object-holder is mounted to the stage and is configured to hold the object on the stage. The at least one actuator is situated and configured to move the stage at least in a gravity direction. The position-detector is situated relative to the stage and is configured to determine a position of the stage at least in the gravity direction. The position-detector produces a first position signal whenever the position-detector detects a first displacement of the stage in the gravity direction caused by a collective mass of the stage and object-holder and produces a second position signal whenever the position-detector detects a second displacement of the stage in the gravity direction caused by a collective mass of the stage, object-holder, and object being held by the object-holder. The object robot is situated relative to the stage and is operable to deliver the object for holding by the object-holder and to receive the object released from the object-holder. The controller is connected to the position-detector and to the at least one actuator. The controller produces a first control signal upon receiving the first position signal and a second control signal upon receiving the second position signal, wherein the first control signal and second control signal cause the at least one actuator to place the stage at a desired position in the gravity direction whenever the object-holder has not received and whenever the object-holder has received, respectively, the object from the object robot. The controller also determines whether the object has not been received or has been received by the object-holder from the object robot based on whether the controller is receiving the first position signal or the second position signal, respectively.

If the object is a reticle, then the object-chuck can be configured as a reticle chuck, wherein the object robot can include an end effector configured to hold the reticle as the object robot positions the reticle adjacent the reticle chuck for holding by the reticle chuck. The stage can be configured to hold the reticle chuck face-down, in which event the reticle chuck can hold the reticle face-down.

According to other aspects, various microlithography systems are provided that typically include an illumination-optical system, a projection-optical system, and any of the various stage devices summarized above or otherwise disclosed herein. For example, the subject stage device(s) can include a reticle stage. Further by way of example, if the illumination-optical system and projection-optical system are configured to perform lithographic exposures using EUV light, then the reticle stage can be configured to hold the reticle face down.

According to another aspect, methods are provided for detecting the holding status of an object (which has a mass) delivered to an object-holder for holding by the object-holder, wherein the object-holder includes at least one actuator for moving the object-holder and at least one position sensor. According to an embodiment of such a method, in a situation in which the object-holder is not holding the object, a first position of the object-holder is sensed so as to produce a first position signal. Based on the first position signal, a corresponding first force signal is delivered to the at least one actuator to hold the object-holder at a predetermined position. The object-holder is caused to hold the object, wherein the mass of the object added to the object-holder urges the object-holder to move to a second position. The second position is sensed to produce a second position signal. Based on the second position signal, a corresponding second force signal is delivered to the at least one actuator to hold the object-holder at the predetermined position. The first and second force signals are compared to determine whether the object is or is not being held by the object-holder. If the first and second force signals are similar, then the object is determined as not being held by the object-holder.

The object usually has a planar configuration having a face, and the object-holder can be configured to hold the object face-down. In this instance, the first and second positions of the object-holder usually are determined in a direction having a vertical component.

The object-holder can include multiple position sensors for determining position of the object-holder in multiple degrees of freedom including displacement in a vertical direction, and the object-holder can include multiple actuators for moving the object-holder in multiple degrees of freedom including displacement in the vertical direction. In this situation the predetermined position usually is a position in the vertical direction.

The position sensors can provide respective components of the first position signal and the second position signal in the vertical direction. In this situation, when the object-holder should be holding the object, the respective first and second position signals produced by the position sensors are sensed. From the first and second position signals, respective first and second force signals are delivered to the actuators to hold the object-holder at the predetermined position. From the first and second force signals, a determination is made of whether the object-holder is completely or incompletely holding the object.

The foregoing and additional features and advantages of the subject of the instant disclosure will be more readily apparent from the following detailed description, which proceeds with reference to the accompanying drawings.

DETAILED DESCRIPTION

This disclosure is set forth in the context of a representative embodiment that is not to be construed as limiting in any way. In addition, although the disclosure is set forth in the context of a reticle stage as used for extreme ultraviolet lithography (EUVL) systems, the subject devices and methods are not limited to reticle stages and are not limited to stages used with EUVL systems. For example, the subject devices and methods can be used in connection with reticle stages used in other types of lithography systems and/or in connection with substrate stages, for example. Further alternatively, the subject devices and methods can be used with stages or other platforms used in other types of equipment, such as electron microscopes, vacuum-deposition equipment, and ion-etching equipment. Furthermore, although the disclosure is set forth in the context of a stage that faces downward, the subject devices and methods also are applicable to stages that face upward or have any other orientation.

Figure 1:
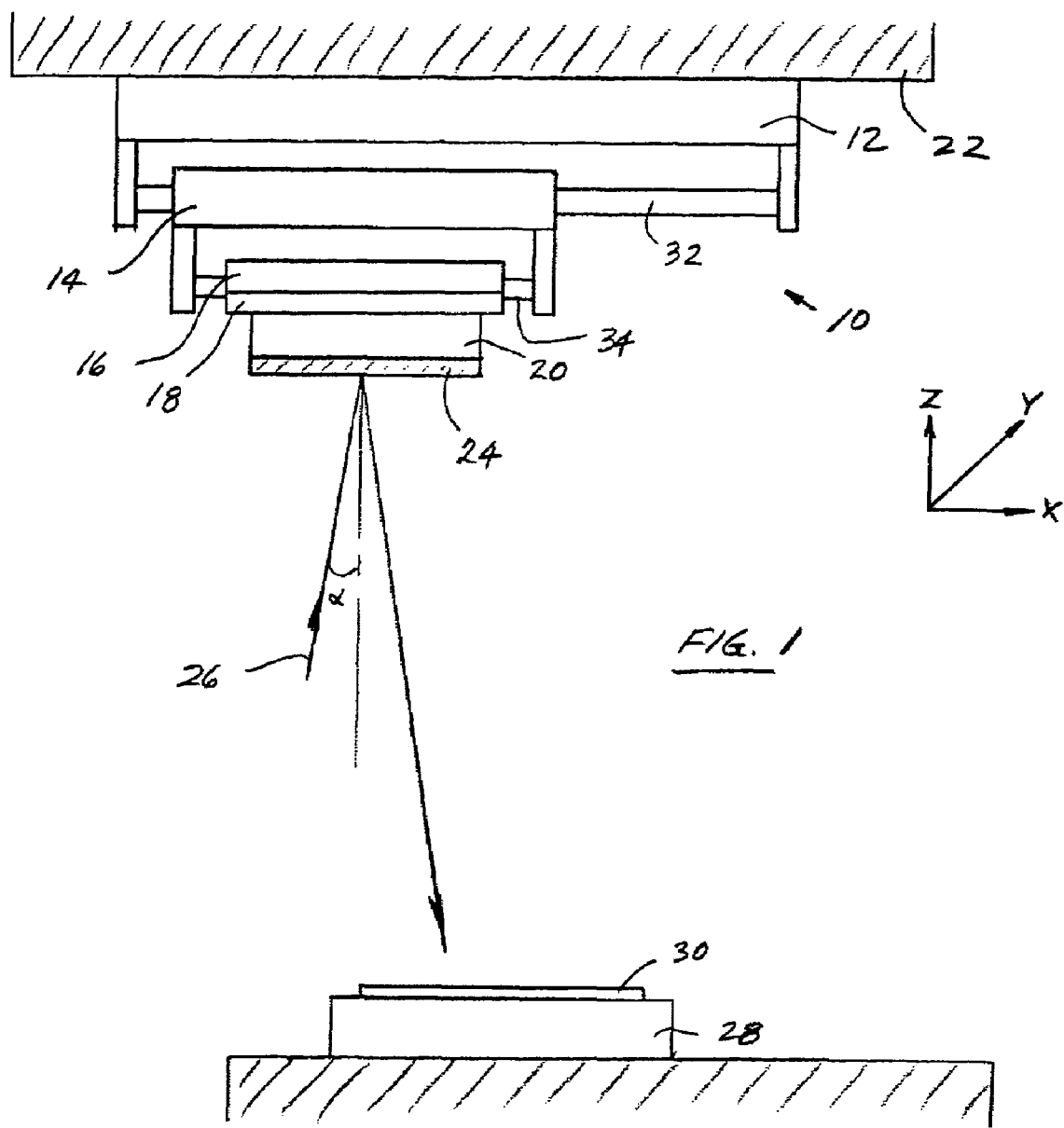
FIG. 1 is a schematic elevational view showing exemplary relationships of various portions of the reticle stage, reticle chuck, reticle, and wafer.

For the purpose of this discussion, and turning first to FIG. 1, an exemplary reticle stage 10 is shown that holds a reticle face-side down. The reticle stage 10 comprises a stage base 12 (stationary portion), a coarsely movable portion ("reticle coarse stage" 14), a finely movable portion ("reticle fine stage" 16), a reticle table 18 mounted to the reticle fine stage 16, and a reticle chuck 20 mounted to the reticle table 18. (Alternatively, the reticle chuck 20 can be mounted directly to the reticle fine stage 16, in which configuration the reticle chuck serves as the reticle "table" and eliminates the need for a separate reticle table 18.) The stage base 12 is typically mounted to a main frame 22 or analogous stationary structure of the lithography system. The reticle coarse stage 14 is configured for relatively large movements of itself (and structure mounted to it) relative to the stage base 12, and the reticle fine stage 16 is configured for relatively small movements of itself (and structure mounted to it) relative to the reticle coarse stage 14 and hence also relative to the stage base 12. In an EUVL system as currently available, the reticle chuck 20 characteristically faces downward, so a reticle 24 mounted on the reticle chuck 20 is illuminated by a beam of EUV light 26 propagating substantially upward toward the reticle. The EUV light 26 normally is incident on the reticle 24 at a small angle of incidence ($\alpha \sim 5°$).

Figure 4:
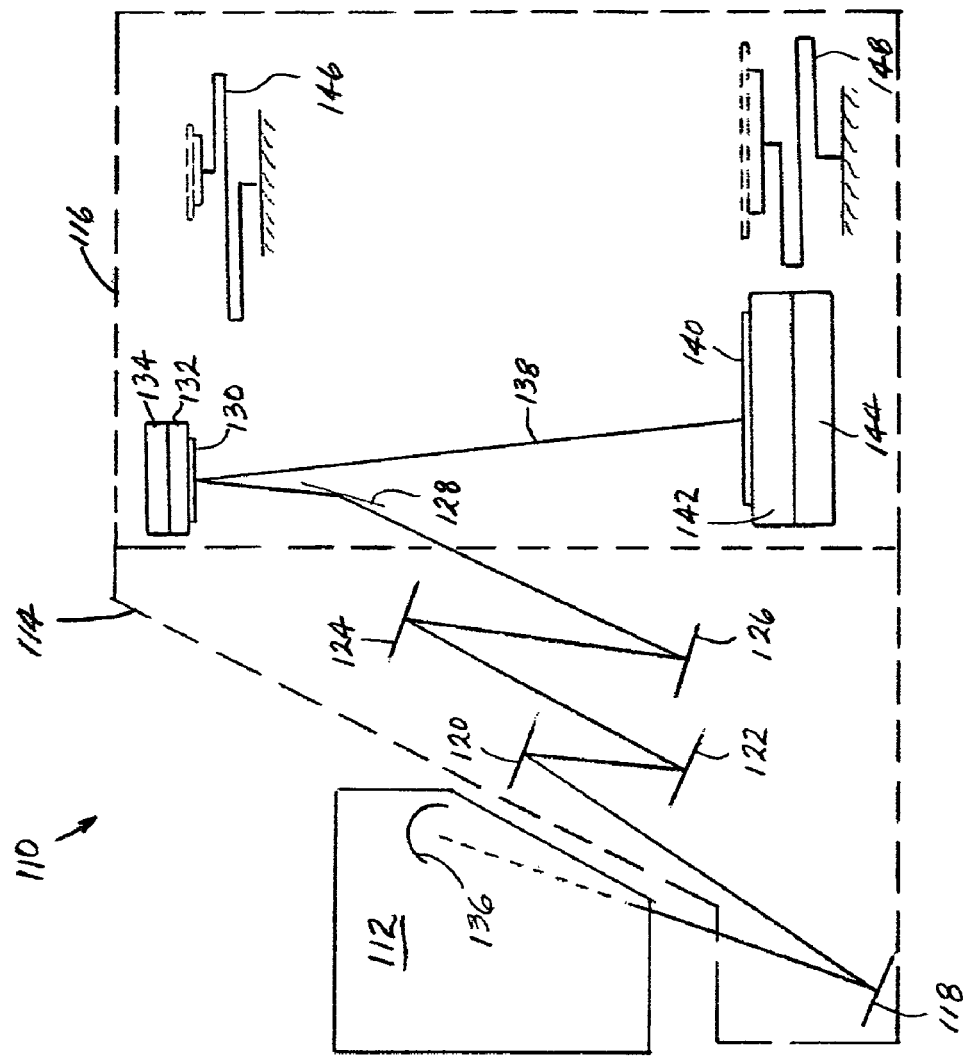
FIG. 4 is a schematic elevational view of certain components in the illumination-optical system and projection-optical system of a conventional EUVL system.

To avoid scattering and absorption of the EUV beam, the beam and its optics must be situated in a vacuum chamber (not detailed) evacuated to a suitable vacuum level. Consequently, the reticle stage 10 and wafer stage 28 (holding the wafer 30) also are situated in the vacuum chamber, and the various components and assemblies making up these stages are capable of functioning in a vacuum environment. By way of example, in FIG. 4 the area shown as the projection-optical system 116 is a vacuum chamber containing the reticle stage 134 and the wafer stage 144.

As noted, the stage base 12 is mounted to a structural frame 22 of the EUVL system. The structural frame 22 normally is extremely stable and vibration-free. To achieve such stability, active vibration-isolation (AVIS) devices (not shown, but well understood) can be situated between the structural frame 22 and the floor upon which the frame rests. Alternatively or in addition, AVIS devices can be located between a first frame portion that rests upon the floor and a second frame portion to which the stage base is mounted, or located between the frame 22 and the stage base 12. It is desirable not only that vibrations not be transmitted to the reticle stage 10 from the floor or from other structures (e.g., the substrate stage) of the EUVL system but also that vibrations caused by reticle-stage movement not be transmitted through the frame to other structures of the EUVL system.

The reticle coarse stage 14 is movable relative to the stage base 12. For achieving such motion, one or more actuators 32 are used. Usually, at least one respective actuator is used for providing motion in each degree of freedom of motion of the reticle coarse stage. For example, if the reticle coarse stage 14 is movable in each of the x- and y-directions, then at least one respective actuator is usually provided for moving the reticle coarse stage 14 in each direction. If the stage is used in a vacuum environment, then the actuators 32 must be operable in a vacuum environment. Exemplary actuators include electrostatic actuators, Lorentz-force actuators (e.g., voice-coil motors, linear motors, planar motors), pneumatic actuators (e.g., air cylinders), ultrasonic actuators, and "EI" actuators (electromagnetic core actuators). Reticle coarse stages typically have long-stroke movability in one of the x- and y-directions and short-stroke movability in the other of the x- and y-directions, and certain actuators may be more appropriate for one motion but not the other. For example, for long-stroke motion along an axis, a respective linear motor is often used. For short-stroke motion along an axis, a pneumatic actuator can be used effectively, especially if it is desired that the actuator not generate any possible strong magnetic fields. Movements can be guided by guide bars or the like (not shown) or can be guideless.

Alternatively to using x- and y-linear motors, x-y motion of the reticle coarse stage 14 can be achieved using a planar motor, in which an armature coil (having two-dimensionally arranged coils in facing positions) is situated relative to a two-dimensional array of magnets. Either the magnet array or the armature coil can be attached to the reticle coarse stage 14, wherein the other would be attached to the stage base 12. Planar motors also rely on bearings, such as air bearings, to ensure proper functioning and suitable isolation of the moving part relative to the stationary part.

The reticle coarse stage 14 in the depicted embodiment does not contact the stage base 12, which is especially desirable for reducing friction as much as possible, for vibration isolation, and for extremely smooth operation. In fact, certain actuators such as linear motors and planar motors rely upon appropriately placed bearings of the moving part relative to the non-moving part to ensure proper operation of the actuators. Isolation can be achieved in any of several ways, such as by electrical or magnetic levitation or by pneumatic means. Exemplary pneumatic means are gas (e.g., air) bearings. Typically, in a vacuum environment, gas bearings are arranged in opposed pairs to generate a pre-load force. Another means of generating a pre-load force in a vacuum is to use a magnetic force between a permanent magnet and a strip of magnetic material, such as iron. Isolation generally is maintained at all times, even whenever the reticle coarse stage is stationary.

Desirably, the reticle coarse stage 14 is movable in at least three degrees of freedom of motion (x, y, $\theta_z$) relative to the stage base 12. ($\theta_z$ is rotation angle of the reticle about the z-axis.) A sufficient number and configuration of actuators 32 (at least one respective actuator for each degree of freedom) are provided for achieving this motion. The actuators 32 function, (i.e., actuate or not actuate) under the control of a control system (not shown).

It will be understood that, for some applications, the actuators need not be non-contacting types, and that the reticle coarse stage can be in actual contact with the stage base. Even in this situation, appropriate bearings are used, such as any of various ball-bearing and roller-bearing schemes.

The position of the reticle coarse stage 14 relative to the stage base 12 desirably is detected and monitored continuously and in real time. The results of such detections are used, for example, in determining whether the reticle 24 is at or near a desired position relative to the substrate 30 and/or relative to the projection-optical system. For making these detections, multiple position sensors are used, usually at least one sensor for each degree of freedom of motion.

Thus, each degree of freedom of motion desirably has at least one respective actuator and at least one respective position sensor. Particularly advantageous sensors comprise respective interferometers (not shown, but well understood). For example, a first interferometer can be used for determining position of the reticle coarse stage 14 along the x-axis, a second interferometer can be used for determining position of the reticle coarse stage 14 along the y-axis, and a third interferometer can be used for determining the angular position ($\theta_z$) of the reticle coarse stage 14 about the z-axis, wherein x, y, and z are the usual orthogonal Cartesian axes, "z" is conventionally understood to be the vertical Cartesian axis, and the x- and y-axes conventionally define a horizontal plane.

Alternatively to interferometers, any of various other position sensors can be used if these alternative sensors exhibit a performance specification equal to the task. Examples of alternative position sensors include, but are not limited to, capacitance-based probes and encoders (e.g., glass scales and optical sensors). A stage assembly provided with exemplary sensors is described in Binnard et al., U.S. Patent Publication No. US 2002/0109823, incorporated herein by reference.

The reticle fine stage 16 can be isolated from the reticle coarse stage 14 or linked to the reticle coarse stage 14 such as by flexures (not shown) or other suitable linkages that permit a limited range of motion of the reticle fine stage 16 relative to the reticle coarse stage 14. To achieve motion of the reticle fine stage 16 relative to the reticle coarse stage 14, actuators 34 are used that are especially capable of providing extremely fine motions. The actuators can be part of the linkage.

It is desirable that the reticle fine stage 16 be movable in all six degrees of freedom (x, y, z, $\theta_x$, $\theta_y$, $\theta_y$). This range of motions usually requires at least one respective actuator per degree of freedom. By way of example, suitable actuators are piezoelectric actuators as discussed in U.S. Pat. Nos. 6,693,284 and 6,867,534 to Tanaka, both incorporated herein by reference. These and other suitable actuators typically have extremely small ranges of motion, especially compared to the actuators 32 usually desired for moving the reticle coarse stage 14.

Additionally, the reticle table 18 (and thus the reticle chuck 20) desirably is mounted to the reticle fine stage by an appropriate linkage, such as an air-spring linkage, to provide vibration isolation. If air springs are used, for example, typically at least three air springs are used for supporting the reticle table in a tripod fashion. If the reticle table 18 is not used, then the reticle chuck 20 can be mounted directly to the reticle fine stage 16 in this or other suitable manner.

The reticle chuck 20 can be, for example, any of various types of chucks currently available, such as an electrostatic chuck, a vacuum chuck, a Johnsen-Rahbek type of electrostatic chuck, or a Coulomb-type of electrostatic chuck.

The position of the reticle fine stage 16 is detected and monitored continuously and in real time. For making these detections, multiple position sensors typically are used. Exemplary position sensors are respective interferometers. For example, a first interferometer can be used for determining position along the x-axis, a second interferometer can be used for determining position along the y-axis, a third interferometer can be used for determining position along the z-axis, a fourth interferometer can be used for determining angular orientation ($\theta_z$) about the z-axis, a fifth interferometer can be used for determining tilt ($\theta_x$) about the x-axis, and a sixth interferometer can be used for determining tilt ($\theta_y$) about the y-axis. Alternatively, certain interferometers can be arranged to provide positional data in more than one degree of freedom of motion, thereby providing a way to eliminate at least one interferometer and simplify the overall system. It has been discovered that, because of their extreme sensitivity, interferometric position sensors (as well as other types of position sensors) can detect changes in mass of the object whose position is being monitored. This capability of position sensors is exploited in the instant invention.

Stage movements generate reaction forces that can have an adverse effect on the microlithography system. For example, reaction forces generated by motion of the reticle stage 10 can be released mechanically to the system base or to the ground by using a frame member as described in U.S. Pat. No. 5,874,820, incorporated herein by reference. See also U.S. Pat. No. 5,528,118, incorporated herein by reference, for related discussion of reaction forces generated by motion of the wafer stage.

Figure 2:
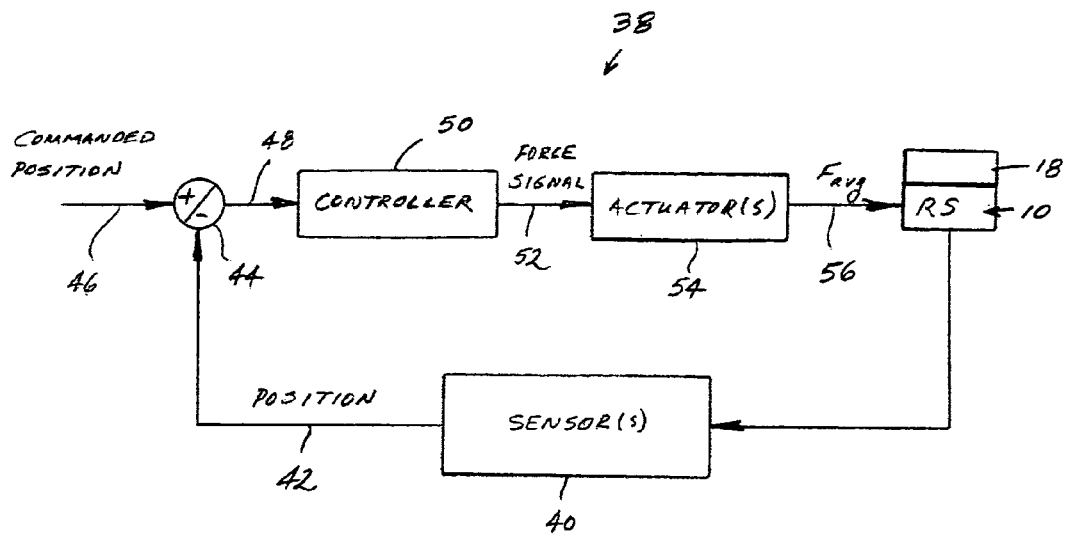
FIG. 2 is an exemplary control diagram of a feedback loop for positioning the reticle stage, wherein the feedback loop is exploited for determining if and when a reticle has been fully chucked to the reticle chuck on the reticle stage.

A block diagram of a reticle-stage control system 38 is depicted in FIG. 2. The depicted system 38 is representative of a control system 38 for controlling the position of the reticle fine stage 16 in one degree of freedom (in the z-direction, for example) based on data provided by at least one respective position sensor 40. In this example, the position sensor 40 generates a position signal 42 representing displacement of the reticle fine stage 16 (and thus of structure attached to it such as the reticle table 18 and/or the reticle chuck 20) in the z-direction relative to the stage base 12. The position signal 42 is compared at a summing junction 44 with a reference ("commanded") position signal 46. The reference position signal 46 corresponds to a desired position of the reticle fine stage 16 along the z-axis. The summing junction 44 sends an output-position-and-error signal 48 received by a controller 50 (e.g., lead-lag, PID, or other suitable controller), which determines a suitable force signal 52 based on the output-position-and-error signal 48. At least one actuator 54 generates a corresponding force $F_{avg}$ (56) acting on the reticle fine stage 16 to achieve a desired position of the reticle fine stage. Achievement of the desired position is sensed by the at least one sensor 40. Thus, the control system 38 shown in FIG. 2 comprises a feedback loop for reticle-fine-stage position in the z-direction. This feedback loop desirably is effected by and under the control of a system controller (not shown, but well understood) operating according to appropriate software. The detection of position by the at least one sensor and the corresponding actuation of the at least one actuator occur substantially in real time.

Generally, a respective control system 48 (with respective feedback loop) is used for each degree of freedom of motion of the reticle table 18. For example, the following motions have at least a component in the z-direction: $\theta_x$, $\theta_y$, z, and each would be governed by a respective control system controlling the respective actuator(s) and utilizing the respective position sensor(s).

Figure 3:
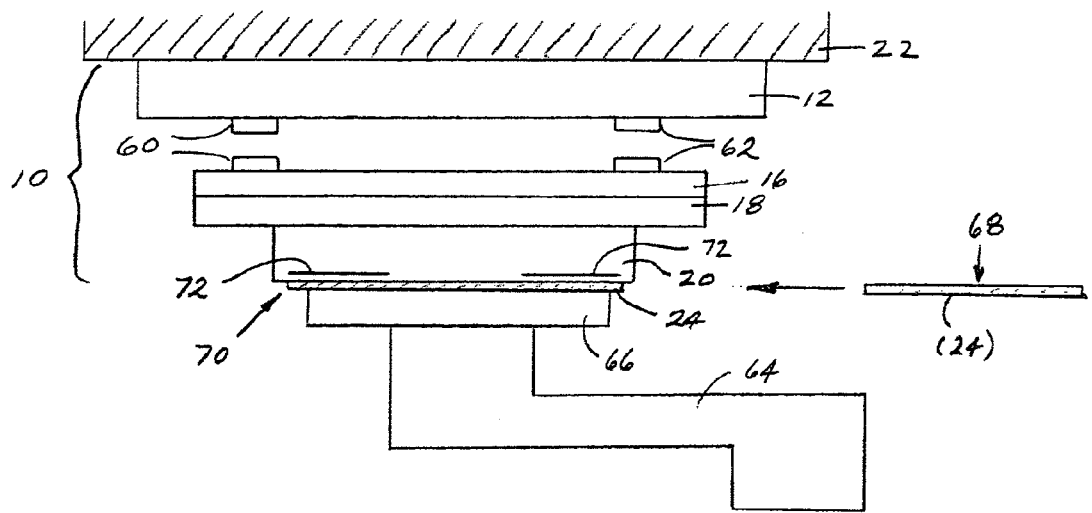
FIG. 3 is a schematic elevational view of a reticle placed in position on a reticle chuck on a reticle stage, using a reticle manipulator.

Reference is now made to FIG. 3, which depicts the frame 22, the reticle-stage base 12 mounted to the frame, a reticle fine stage 16 and table 18, and a reticle chuck 20 mounted to the reticle table 18. Between the stage base 20 and the reticle fine stage 16, 18 are an actuator 60 and a position sensor 62. (Only one of each is shown for simplicity; typically, multiple actuators and position sensors would be used.) A reticle handler (robot) 64 is situated relative to the reticle stage 10 and comprises an end-effector 66 that picks up and removes a reticle 24 (having mass "m") from a first position 68 (e.g., a storage position) and moves the reticle to a second position 70 adjacent the reticle chuck 20. During normal operation, after the reticle handler 64 has brought the reticle 24 to the second position 70 in close proximity to the reticle chuck 20, electrodes 72 in or on the surface of the reticle chuck 20 are energized to attract the reticle 24 to the surface of the chuck 20. If the reticle 24 becomes attached to the chuck surface in the desired manner, the mass "m" of the reticle 24 becomes added to the combined mass of the reticle fine stage 16, 18 and reticle chuck 20. This additional mass "m" imposes a corresponding increase (by m·g, wherein "g" is acceleration due to gravity) in force applied to the reticle fine stage 16, 18 and reticle chuck 20 in the vertical direction, which causes a corresponding instantaneous displacement of the reticle fine stage 16, 18 in the vertical direction. The displacement is sensed by the position sensor(s) 40, and the displacement instantaneously initiates the generation of a corrective signal 52 by the controller 50. Based on the corrective signal 52, an actuator or appropriate combination of actuators produces instantaneously a corresponding corrective force $F_{avg}$ (54) to the reticle fine stage 16, 18 and chuck 20.

A properly chucked reticle 24 is sensed principally by the z-direction position sensor. As noted earlier, $\theta_x$ and $\theta_y$ are tilts of the reticle fine stage 16, 18 about the x- and y-axes, respectively. At the moment the electrodes 72 are energized for holding the reticle 24, proper chucking requires that the reticle at the second position 70 be immediately adjacent (i.e., just below) and parallel to the chuck surface. At the instant of chucking, if one edge of the reticle 24 contacts the chuck surface first, then a corresponding torque would be applied instantaneously to the chuck 20 and fine stage 16, 18, as sensed by one or both the $\theta_x$ and $\theta_y$ position sensor(s) in addition to the z-position sensor. If the reticle 24 becomes properly chucked nevertheless, then the restoration of force m·g substantially in the z-direction would be sensed and appropriate actuation in the z-direction would be initiated, thereby establishing a condition allowing the end-effector 66 to be retracted. But, if the sensed $\theta_x$ and $\theta_y$ torque situation persists, then an improperly or incompletely chucked reticle 24 would be indicated, the end-effector 66 would not be retracted, and damage to the reticle 24 would be prevented. If, at the moment the electrodes 72 are energized, no force $F_{avg}$=m·g is detected by any of the position sensors 40, then no mass "m" has been added to the mass of the fine stage 16, 18 and chuck 20, indicating that the reticle 24 is not chucked at all. In such a situation, the end-effector 66 would not be retracted, and damage to the reticle would be prevented. Thus, the position sensors can detect whether the reticle is in the proper orientation for secure chucking.

Advantageously, the manner of detecting proper chucking described above can be implemented in existing stage-control software without having to make any changes to the stage hardware. This manner of detecting the chucking status of a reticle 24 is in contrast to conventional methods that require either additional sensors, such as reflective sensors, or break-beam sensors to sense the presence of the reticle on the reticle chuck.

A microlithography system including the above-described chucking detection device can be constructed by assembling various assemblies and subsystems in a manner ensuring that prescribed standards of mechanical accuracy, electrical accuracy, and optical accuracy are met and maintained. To establish these standards before, during, and after assembly, various subsystems (especially the optical systems) are assessed and adjusted as required to achieve the specified accuracy standards. Similar assessments and adjustments are performed as required of the mechanical and electrical subsystems and assemblies. Assembly of the various subsystems and assemblies includes the creation of optical and mechanical interfaces, electrical interconnections, and plumbing interconnections as required between assemblies and subsystems. After assembling the microlithography system, further assessments, calibrations, and adjustments are made as required to ensure attainment of specified system accuracy and precision of operation. To maintain certain standards of cleanliness and avoidance of contamination, the microlithography system (as well as certain subsystems and assemblies of the system) are assembled in a clean room or the like in which particulate contamination, temperature, and humidity are controlled.

Figure 5:
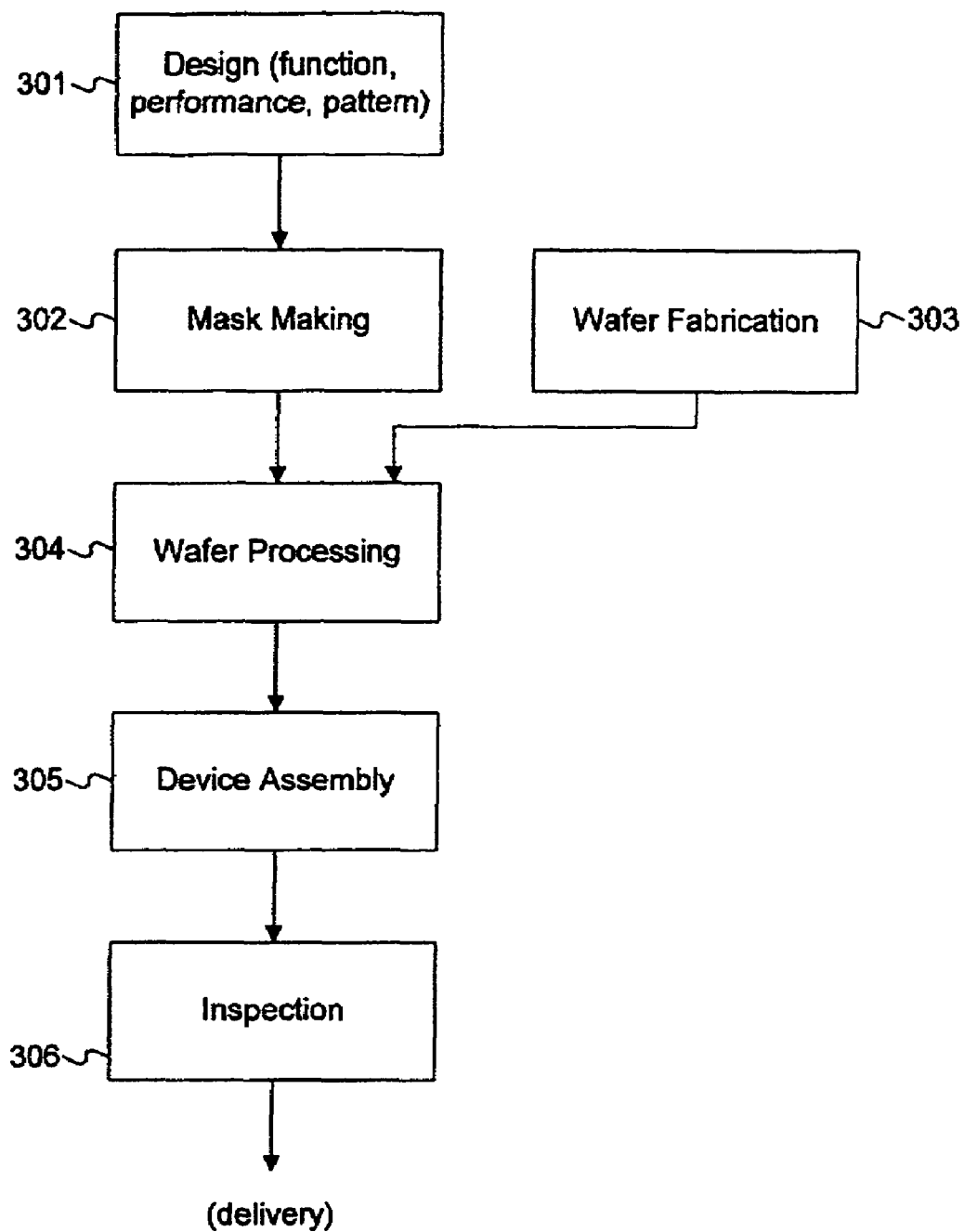
FIG. 5 is a flow chart outlining an exemplary process for manufacturing a semiconductor device, wherein the process includes at least one microlithography step performed using a microlithography system as described herein.

Semiconductor devices can be fabricated by processes including microlithography steps performed using a microlithography system as described above. Referring to FIG. 5, in step 301 the function and performance characteristics of the semiconductor device are designed. In step 302 a reticle defining the desired pattern is designed according to the previous design step. Meanwhile, in step 303, a substrate (wafer) is made and coated with a suitable resist. In step 304 the reticle pattern designed in step 302 is exposed onto the surface of the substrate using the microlithography system. In step 305 the semiconductor device is assembled (including "dicing" by which individual devices or "chips" are cut from the wafer, "bonding" by which wires are bonded to the particular locations on the chips, and "packaging" by which the devices are enclosed in appropriate packages for use). In step 306 the assembled devices are tested and inspected.

Figure 6:
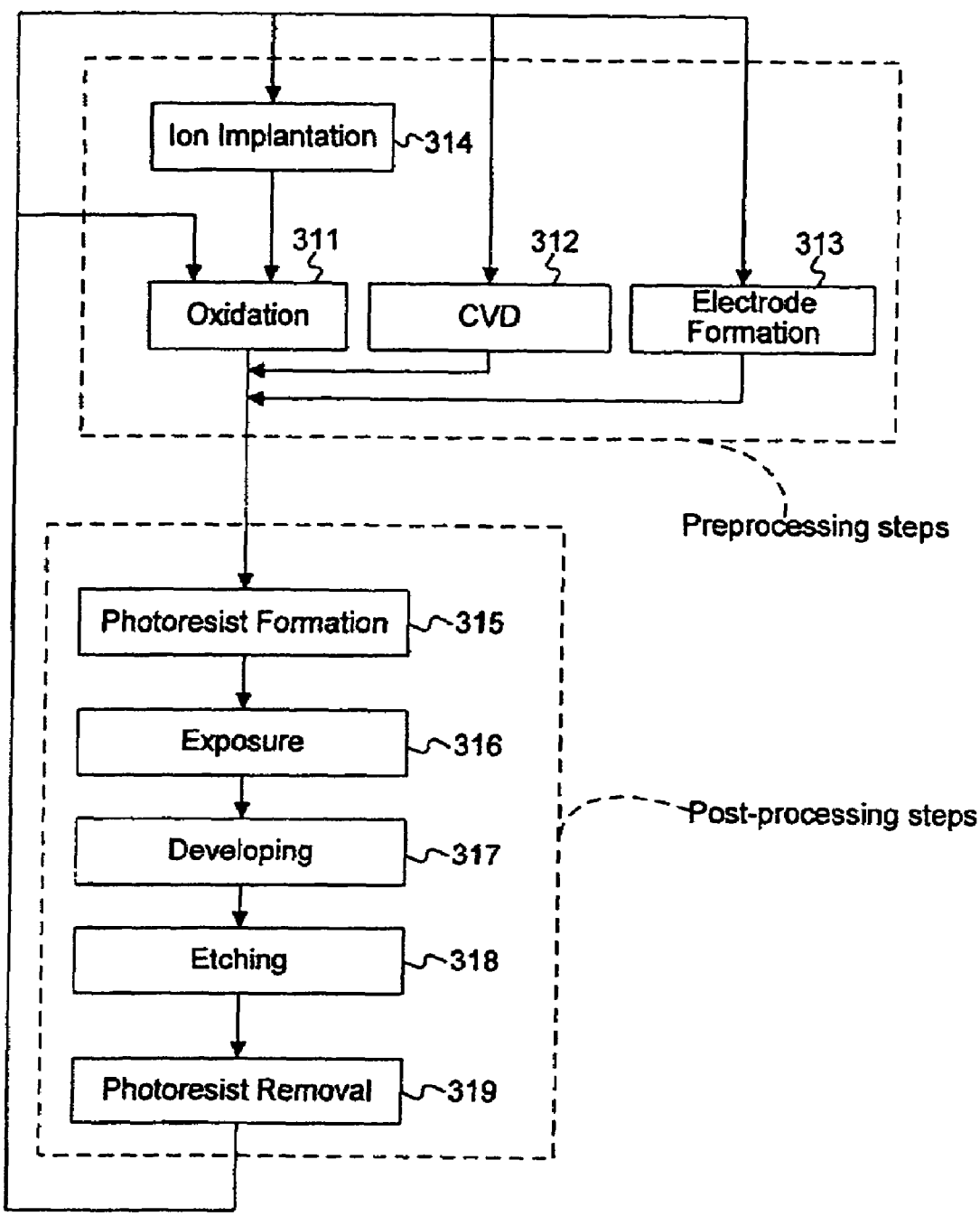
FIG. 6 is a flow chart outlining an exemplary microlithography step.

Representative details of an exemplary microlithography step 304 are shown in FIG. 6. In step 311 (oxidation) the wafer surface is oxidized. In step 312 (CVD) an insulative layer is formed on the wafer surface. In step 313 (electrode formation) electrodes are formed on the wafer surface by vapor deposition for example. In step 314 (ion implantation) ions are implanted in the wafer surface. These steps 311-314 constitute representative "pre-processing" steps for wafers, and selections are made at each step according to processing requirements.

At each stage of wafer processing, when the pre-processing steps have been completed, the following "post-processing" steps are implemented. A first post-process step is step 315 (photoresist formation) in which a suitable resist is applied to the surface of the wafer. Next, in step 316 (exposure), the microlithography system described above is used for lithographically transferring a pattern from the reticle to the resist layer on the wafer. In step 317 (development) the exposed resist on the wafer is developed to form a usable mask pattern, corresponding to the resist pattern, in the resist on the wafer. In step 318 (etching), regions not covered by developed resist (i.e., exposed material surfaces) are etched away to a controlled depth. In step 319 (photoresist removal), residual developed resist is removed ("stripped") from the wafer.

Formation of multiple interconnected layers of circuit patterns on the wafer is achieved by repeating the pre-processing and post-processing steps as required. Generally, a set of pre-processing and post-processing steps are conducted to form each layer.

It will be apparent to persons of ordinary skill in the relevant art that various modifications and variations can be made in the methods described above, in the stage device, in the stage-device control systems, in materials, and in construction without departing from the spirit and scope of this disclosure.

What is claimed is:

1. A stage device for holding an object, comprising:
   a movable object-holder configured to hold the object;

at least one actuator situated and configured to move the object-holder;

a position-detector situated and configured to determine a position of the object-holder, the position-detector producing a first position signal whenever the object-holder is not holding the object and producing a second position signal whenever the object-holder is holding the object; and a controller connected to the position-detector and to the at least one actuator, the controller being configured to produce a first control signal upon receiving the first position signal and to produce a second control signal upon receiving the second position signal, the first and second control signals causing the at least one actuator to place or hold the object-holder at a pre-determined position whether the object-holder is not holding or is holding the object, the controller being further configured to determine whether the object is not being held or is being held by the object-holder based on whether the controller is receiving the first position signal or the second position signal, respectively.

2. The stage device of claim 1, configured as a reticle stage, wherein:

the object is a reticle;

the object-holder comprises a reticle fine stage and a reticle chuck mounted on the reticle fine stage;

the at least one actuator is configured to move the reticle fine stage and thus the reticle chuck; and the first and second control signals cause the at least one actuator to place or hold the reticle fine stage, and thus the reticle chuck, at the predetermined position.

3. The stage device of claim 2, wherein the reticle chuck holds the reticle face-down.

4. A microlithography system, comprising:

an illumination-optical system;

a projection-optical system; and the stage device of claim 1.

5. The microlithography system of claim 4, wherein the stage device is a reticle stage.

6. The microlithography system of claim 4, wherein:

the illumination-optical system and projection-optical system are configured to perform lithographic exposures using EUV light; and the reticle stage is configured to hold the reticle face down.

7. A stage system for holding an object, comprising:

a movable object-holder configured to hold the object;

at least one actuator situated and configured to move the object-holder;

a position-detector situated and configured to determine a position of the object-holder, the position-detector producing a first position signal whenever the object-holder is not holding the object and producing a second position signal whenever the object-holder is holding the object;

an object robot situated relative to the object-holder and operable to deliver the object for holding by the object-holder and to receive the object released from the object-holder; and a controller connected to the position-detector and to the at least one actuator, the controller being configured to produce a first control signal upon receiving the first position signal and to produce a second control signal upon receiving the second position signal, the first and second control signals causing the at least one actuator to place or hold the object-holder at a pre-determined position whether the object-holder is not holding or is holding the object delivered by the object robot, the controller being further configured to determine whether the object is not being held or is being held by the object-holder based on whether the controller is receiving the first position signal or the second position signal, respectively.

8. A stage device, comprising:

an object-holder configured to hold an object and that is movable at least in a movement direction having a vertical component;

at least one actuator situated and configured to move the object-holder in the movement direction;

at least one position-detector situated and configured to determine a position of the object-holder in the movement direction; and a controller connected to the at least one actuator and to the at least one position-detector in a feedback-controlled manner such that data from the at least one position-detector is fed-back to the controller to maintain the object-holder at a predetermined position in the movement direction, wherein the controller, based on the fed-back data, causes a respective energization, depending upon whether the object-holder is holding the object or not holding the object, of the at least one actuator as required to maintain the object-holder at the predetermined position, the fed-back data providing an indication of whether or not the object is being held by the object-holder.

9. The stage device of claim 8, configured as a reticle stage, wherein:

the object is a reticle;

the object-holder comprises a reticle fine stage and a reticle chuck mounted on the reticle fine stage;

the at least one actuator is configured to move the reticle fine stage and thus the reticle chuck in the movement direction; and based on the fed-back data, the controller causes the at least one actuator to place or hold the reticle fine stage, and thus the reticle chuck, at the predetermined position.

10. The stage device of claim 9, wherein the reticle chuck holds the reticle face-down.

11. A microlithography system, comprising:

an illumination-optical system;

a projection-optical system; and the stage device of claim 8.

12. The microlithography system of claim 11, wherein the stage device is a reticle stage.

13. The microlithography system of claim 11, wherein:

the illumination-optical system and projection-optical system are configured to perform lithographic exposures using EUV light; and the reticle stage is configured to hold the reticle face down.

14. A stage system for holding an object, comprising:

an object-holder configured to hold an object and that is movable at least in a movement direction having a vertical component;

at least one actuator situated and configured to move the object-holder in the movement direction;

at least one position-detector situated and configured to determine a position of the object-holder in the movement direction;

an object robot situated relative to the object-holder and operable to deliver the object for holding by the object-holder and to receive the object released from the object-holder; and a controller connected to the at least one actuator and to the at least one position-detector in a feedback-controlled manner such that data from the at least one position-detector is fed-back to the controller to maintain the object-holder at a predetermined position in the movement direction, wherein the controller, based on the fed-back data, causes a respective energization, depending upon whether the object-holder is holding or not holding the object delivered to the object-holder by the object robot, of the at least one actuator as required to maintain the object-holder at the predetermined position, the fed-back data providing an indication of whether or not the object delivered by the object robot is being held by the object-holder.

15. A stage device, comprising:
object-holding means for holding an object and for moving the object at least in a movement direction having a vertical component;
actuator means for moving the object-holding means in the movement direction;
detection means for determining a position of the object-holding means in the movement direction;
control means for actuating the actuator means based on a signal from the detection means; and
feed-back means for feeding data from the detection means back to the control means, with which fed-back data the control means maintains the object-holding means at a predetermined position in the movement direction by causing a respective energization of the actuator means depending upon whether the object-holding means is holding the object or not holding the object, the fed-back data providing an indication of whether or not the object is being held by the object-holding means.

16. The stage device of claim 15, configured as a reticle stage, wherein:
the object is a reticle;
the object-holding means comprises a stage means and a reticle-chuck means mounted on the stage means;
the actuator means is configured to move the stage means and thus the reticle-chuck means; and
the control means, based on data fed back by the feed-back means, causes the actuator means to place the stage means, and thus the reticle-chuck means, at the predetermined position.

17. The stage device of claim 16, wherein the reticle-chuck means holds the reticle face-down.

18. A microlithography system, comprising:
an illumination-optical system;
a projection-optical system; and
the stage device of claim 15.

19. The microlithography system of claim 18, wherein the stage device is a reticle stage.

20. The microlithography system of claim 18, wherein:
the illumination-optical system and projection-optical system are configured to perform lithographic exposures using EUV light; and
the reticle stage is configured to hold the reticle face down.

21. A stage system for holding an object, comprising:
object-holding means for holding an object and for moving the object at least in a movement direction having a vertical component;
actuator means for moving the object-holding means in the movement direction;
detection means for determining a position of the object-holding means in the movement direction;
object-delivery means for delivering the object for holding by the object-holding means and for receiving the object released from the object-holding means; and
control means for actuating the actuator means based on a signal from the detection means; and
feed-back means for feeding data from the detection means back to the control means, with which fed-back data the control means maintains the object-holding means at a predetermined position in the movement direction by causing a respective energization of the actuator means depending upon whether the object-holding means is holding the object or not holding the object delivered by the object-delivery means, the fed-back data providing an indication of whether or not the object is being held by the object-holding means.

22. A stage device for holding an object having a mass, comprising:
a base;
an object-holder that is movable relative to the base and configured to hold the object;
at least one actuator situated relative to the base and the object-holder and configured to move the object-holder relative to the base;
a position-detector situated relative to the object-holder and configured to determine a position of the object-holder relative to the base, the position-detector being operable to produce a first position signal whenever the position-detector detects a first displacement of the object-holder caused by a collective mass of the object-holder and to produce a second position signal whenever the position-detector detects a second displacement of the object-holder caused by a collective mass of the object-holder and object being held by the object-holder; and
a controller connected to the position-detector and to the at least one actuator, the controller being configured to produce a first control signal upon receiving the first position signal and to produce a second control signal upon receiving the second position signal, the first control signal and second control signal causing the at least one actuator to place the object-holder at a desired position whenever the object-holder is not holding and whenever the object-holder is holding, respectively, the object, the controller being further configured to determine whether the object is not being held or is being held by the object-holder based on whether the controller is receiving the first position signal or the second position signal, respectively.

23. The stage device of claim 22, wherein a difference of the second displacement relative to the first displacement is correlated to the mass of the object times gravitational acceleration.

24. The stage device of claim 22, wherein the object-holder is movable with respect to the base without contacting the base.

25. The stage device of claim 22, wherein the object-holder is an object-chuck.

26. The stage device of claim 25, wherein:
the object is a reticle; and
the object-chuck is a reticle chuck.

27. The stage device of claim 22, wherein the object-holder holds the object face-down.

28. The stage device of claim 22, further comprising:
a coarse stage that is movable relative to the base; and
a fine stage to which the object-holder is mounted, the fine stage being movable relative to the coarse stage and hence to the base.

29. The stage device of claim 22, wherein the object-holder is movable in at least one degree of freedom of motion relative to the base.

30. The stage device of claim 29, wherein:
the object-holder has a mounting surface extending in an xy plane to which a z-axis is perpendicular; and
the at least one degree of freedom includes movement of the object-holder along the z-axis.

31. The stage device of claim 30, wherein the object-holder is movable in multiple degrees of freedom of motion relative to the base.

32. The stage device of claim 31, further comprising at least one respective actuator and at least one respective position-sensor for each degree of freedom of motion.

33. The stage device of claim 32, wherein:
the controller is connected to each actuator and to each position-sensor;
each position-sensor is configured to produce respective first and second position signals;
the controller is configured to produce, for each actuator, respective first and second control signals; and
the controller is further configured to determine whether the object is not being held or is being held by the object-holder based on the first position signals relative to the second position signals, respectively.

34. The stage device of claim 22, wherein the controller is further configured to initiate a first operational response whenever the object is detected as not being held by the object-holder and to initiate a second operational response whenever the object is detected as being held by the object-holder.

35. The stage device of claim 34, wherein:
the first operational response is appropriate for a situation in which the object is not being held by the object-holder, so as to avoid damaging the object; and
the second operational response is appropriate for a situation in which the object is being held by the object-holder.

36. A microlithography system, comprising:
an illumination-optical system;
a projection-optical system; and
the stage device of claim 22.

37. The microlithography system of claim 36, wherein the stage device is a reticle stage.

38. The microlithography system of claim 36, wherein:
the illumination-optical system and projection-optical system are configured to perform lithographic exposures using EUV light; and
the reticle stage is configured to hold the reticle face down.

39. A stage system for holding an object having a mass, comprising:
a base;
an object-holder that is movable relative to the base and configured to hold the object;
at least one actuator situated relative to the base and the object-holder and configured to move the object-holder relative to the base;
a position-detector situated relative to the object-holder and configured to determine a position of the object-holder relative to the base, the position-detector being operable to produce a first position signal whenever the position-detector detects a first displacement of the object-holder caused by a collective mass of the object-holder and to produce a second position signal whenever the position-detector detects a second displacement of the object-holder caused by a collective mass of the object-holder and object being held by the object-holder;
an object robot situated relative to the stage and operable to place the object for holding by the object-holder and to receive the object released from the object-holder; and
a controller connected to the position-detector and to the at least one actuator, the controller being configured to produce a first control signal upon receiving the first position signal and a second control signal upon receiving the second position signal, the first control signal and second control signal causing the at least one actuator to place the object-holder at a desired position whenever the object-holder is not holding and whenever the object-holder is holding, respectively, the object delivered by the object robot, the controller being further configured to determine whether the object is not being held or is being held by the object-holder based on whether the controller is receiving the first position signal or the second position signal, respectively.

40. A stage system for holding an object having a mass, comprising:
a movable stage;
an object-holder mounted to the stage and configured to hold the object on the stage;
at least one actuator situated and configured to move the stage at least in a gravity direction;
a position-detector situated relative to the stage and configured to determine a position of the stage at least in the gravity direction, the position-detector being operable to produce a first position signal whenever the position-detector detects a first displacement of the stage in the gravity direction caused by a collective mass of the stage and object-holder and to produce a second position signal whenever the position-detector detects a second displacement of the stage in the gravity direction caused by a collective mass of the stage, object-holder, and object being held by the object-holder;
an object robot situated relative to the stage and operable to deliver the object for holding by the object-holder and to receive the object released from the object-holder; and
a controller connected to the position-detector and to the at least one actuator, the controller being configured to produce a first control signal upon receiving the first position signal and a second control signal upon receiving the second position signal, the first control signal and second control signal causing the at least one actuator to place the stage at a desired position in the gravity direction whenever the object-holder has not received and whenever the object-holder has received, respectively, the object from the object robot, the controller being further configured to determine whether the object has not been received or has been received by the object-holder from the object robot based on whether the controller is receiving the first position signal or the second position signal, respectively.

41. The stage system of claim 40, wherein the object-holder is an object-chuck.

42. The stage system of claim 41, wherein:
the object is a reticle;
the object-chuck is a reticle chuck; and the object robot includes an end effector configured to hold the reticle as the object robot positions the reticle adjacent the reticle chuck for holding by the reticle chuck.

43. The stage device of claim 42, wherein:
the stage holds the reticle chuck face-down; and
the reticle chuck holds the reticle face-down.

44. A method for detecting the holding status of an object, having a mass, delivered to an object-holder for holding by the object-holder, the object-holder including at least one actuator for moving the object-holder and at least one position sensor, the method comprising:
in a situation in which the object-holder is not holding the object, sensing a first position of the object-holder to produce a first position signal;
based on the first position signal, delivering a corresponding first force signal to the at least one actuator to hold the object-holder at a predetermined position;
causing the object-holder to hold the object, wherein the mass of the object added to the object-holder urges the object-holder to move to a second position;
sensing the second position to produce a second position signal;
based on the second position signal, delivering a corresponding second force signal to the at least one actuator to hold the object-holder at the predetermined position; and
comparing the first and second force signals to determine whether the object is or is not being held by the object-holder.

45. The method of claim 44, wherein, if the first and second force signals are similar, then the object is determined as not being held by the object-holder.

46. The method of claim 44, wherein:
the object has a planar configuration having a face; and
the object-holder is configured to hold the object face-down.

47. The method of claim 46, wherein the first and second positions of the object-holder are determined in a direction having a vertical component.

48. The method of claim 44, wherein:
the object-holder includes multiple position sensors for determining position of the object-holder in multiple degrees of freedom including displacement in a vertical direction;
the object-holder includes multiple actuators for moving the object-holder in multiple degrees of freedom including displacement in the vertical direction; and
the predetermined position is a position in the vertical direction.

49. The method of claim 48, wherein the position sensors provide respective components of the first position signal and the second position signal in the vertical direction, the method further comprising:
when the object-holder should be holding the object, sensing the respective first and second position signals produced by the position sensors;
from the first and second position signals, delivering respective first and second force signals to the actuators to hold the object-holder at the predetermined position; and
from the first and second force signals, determining whether the object-holder is completely or incompletely holding the object.

* * * * *